United States Patent [19]
Ueda et al.

[11] Patent Number: 5,166,088
[45] Date of Patent: Nov. 24, 1992

[54] METHOD OF MANUFACTURING SEMICONDUCTOR DEVICE CONTACT VIAS IN LAYERS COMPRISING SILICON NITRIDE AND GLASS

[75] Inventors: Hirokazu Ueda, Tenri; Hirotoshi Kawahira, Nara, both of Japan

[73] Assignee: Sharp Kabushiki Kaisha, Osaka, Japan

[21] Appl. No.: 719,737

[22] Filed: Jun. 25, 1991

[30] Foreign Application Priority Data

Jul. 3, 1990 [JP] Japan .................... 2-178155
Jul. 4, 1990 [JP] Japan .................... 2-179230

[51] Int. Cl.$^5$ ........................ H01L 21/265
[52] U.S. Cl. ........................ 437/47; 437/60; 437/982; 437/981; 437/978; 437/187; 437/240; 148/DIG. 136
[58] Field of Search ............ 437/47, 60, 52, 48

[56] References Cited

U.S. PATENT DOCUMENTS 5,030,588  7/1991  Hosaka ..................... 437/60

FOREIGN PATENT DOCUMENTS 64-25551  1/1989  Japan .
2219264   8/1990  Japan .

*Primary Examiner*—Olik Chaudhuri
*Assistant Examiner*—Long Pham
*Attorney, Agent, or Firm*—Nixon & Vanderhye

[57] ABSTRACT

A method of manufacturing a semiconductor device, includes the steps of: forming a first insulating layer (3), having at a surface thereof a concave area to which a contact hole is to be formed and a convex area, on a semiconductor substrate (7); forming a high resistance portion (4) including polycrystalline silicon, on the convex area; and forming a protection layer (2) including SiN on the first insulating layer and the high resistance portion. The method also includes the steps of: removing a portion of the formed protection layer at the concave area such that the removed portion includes an area to form the contact hole and is larger than the area to form the contact hole; and forming a second insulating layer (5) including at least boron as an impurity on the protection layer and the first insulating layer. The method further includes the steps of: forming the contact hole at the concave area from the second insulating layer to a surface of the semiconductor substrate by means of an etching technique; and forming a metal wiring (6) in the contact hole and on the second insulating layer.

10 Claims, 4 Drawing Sheets

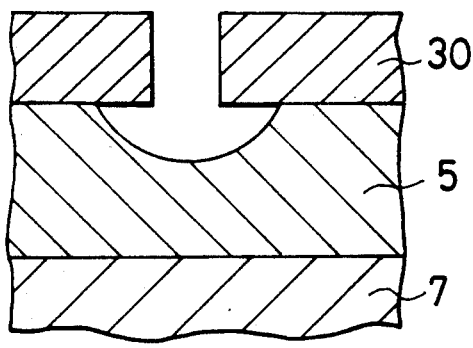
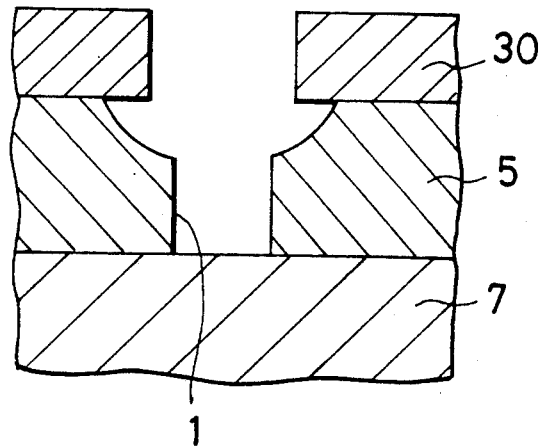
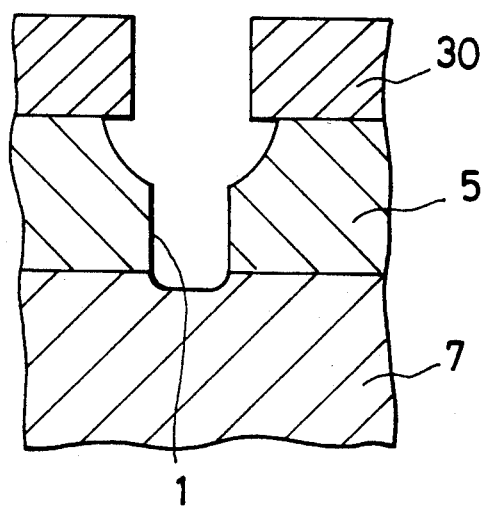

METHOD OF MANUFACTURING SEMICONDUCTOR DEVICE CONTACT VIAS IN LAYERS COMPRISING SILICON NITRIDE AND GLASS

BACKGROUND OF THE INVENTION

1. Field of the Invention

The present invention relates to a method of manufacturing a semiconductor device such as an IC (Integrated Circuit) device and a LSI (Large Scale Integrated) device, and more particularly, the present invention relates to a SRAM (Static Random Access Memory) device which includes a Poly-Si (polycrystalline silicon) having a very high resistance in the range of about 200 G$\Omega$ to 1000 G$\Omega$, for example.

2. Description of the Related Arts

The inventor of the present invention knows one kind of such a method of manufacturing a semiconductor device, which includes a high-resistance polycrystalline silicon film (referred to as a "high-resistance portion", hereinafter) as shown in FIG. 1.

In this manufacturing method, a high-resistance portion 20 is formed on an Si substrate 22 provided with an SiO$_2$ (silicon dioxide) film 26 which is formed by means of a CVD (Chemical Vapor Deposition) method, and then, an SiN (silicon nitride) film 21 is deposited to be formed as a protection film on the SiO$_2$ film 26 and the high-resistance portion 20 by means of the CVD method, so as to accomplish such a structure that the high-resistance portion 20 is covered and thus protected by the SiN film 21. The SiN film 21 protects the high-resistance portion 20 so as not to degrade the high resistance of the high-resistance portion 20 during a subsequent plasma process such as a plasma CVD method to form a CVD film, a RIE (Reactive Ion Etching) process, H$_2$ (hydrogen) sintering process, and so on.

Then, a BPSG (boron phosphosilicate glass) film 23 is deposited on the overall surface, and is melted in an N$_2$ (nitrogen) gas atmosphere with a high temperature of 900° C. to 950° C. Then, a contact hole 24 is formed from the BPSG film 23 to the Si substrate 22 by means of a known technique such as an etching technique. Finally, a metal wiring 25 is formed by means of a spattering method. The SiO$_2$ film 26 having a prescribed uneven surface serves as a foundation pattern on the Si substrate 22.

The above mentioned structure in which the SiN film 21 covers and protects the high-resistance portion 20, has following basic problems.

Firstly, when a process of forming the contact hole 24 is performed by means of the etching technique while the SiN film 21 is preserved, a protruding portion 21a in a peaked shape is formed of the SiN film 21 at the side wall portion of the contact hole 24, as shown in FIG. 1. This is because the etching rate of the SiO$_2$ film 26 as the basic pattern is different from that of the SiN film 21, during the etching process to form the contact hole 24. Then, in a subsequent process to form the metal wiring 25, the metal is disturbed during entry into the contact hole 24 and maybe separated by the existence of the protruding portion 21a, resulting in a certain possibility that an upper metal portion 25a and a lower metal portion 25b of the metal wiring 25 are electrically disconnected from each other.

Secondary, in case that the SiN film 21 having a thickness about 550 Å (Angstrom), for example, is deposited directly on the high resistance portion 20, when a round etch reaches to the SiN film 21 due to the etching dispersion during this etching process of forming the contact hole 24, the SiN film 21 at this relevant portion is etched during a subsequent contact plasma etching process. This results in an undesirable shoulder as indicated by an arrow A1 in FIG. 2, which shows the status before the metal wiring process of the semiconductor device of FIG. 1, to form a hole 27 where the high-resistance portion 20 is exposed. Thus formed, hole 27 causes a quite serious problem such as an electrical shortage, a degradation of the pressure and voltage resisting characteristic, and so on.

Thirdly, during the depositing and the heat-treating processes of forming the BPSG film 23 on the SiN film 21, the N (nitrogen) content of the SiN film 21 and the B (boron) content of the BPSG film 23 may chemically react with each other to produce a chemical compound such as B$_x$N$_y$· nH$_2$O etc., which would appear on the BPSG film 23 as an undesirable alien substance to disturb the subsequent processes, causing the degradation of the manufactured semiconductor device.

SUMMARY OF THE INVENTION

It is therefore an object of the present invention to provide a method of manufacturing a highly reliable semiconductor device.

According to the present invention, the above-mentioned object can be achieved by a first method of manufacturing a semiconductor device, including the steps of: forming a first insulating layer, having at a surface thereof a concave area to which a contact hole is to be formed and a convex area, on a semiconductor substrate; forming a high resistance portion including polycrystalline silicon, on the convex area; and forming a protection layer including SiN on the first insulating layer and the high resistance portion. The first method also includes the steps of: removing a portion of the formed protection layer at the concave area such that the removed portion includes an area to form the contact hole and is larger than the area to form the contact hole; and forming a second insulating layer including at least boron as an impurity on the protection layer and the first insulating layer. The first method further includes the steps of: forming the contact hole at the concave area from the second insulating layer to a surface of the semiconductor substrate by means of an etching technique; and forming a metal wiring in the contact hole and on the second insulating layer.

In the first method, after forming the protection layer on the overall surface of the first insulating layer and the high resistance portion, since the portion of the protection layer at the concave area is removed such that the removed portion includes the area to form the contact hole and is larger than this area to form the contact hole, the protection layer is not exposed at the side wall portion of the contact hole when the contact hole is made from the second insulating layer to the surface of the semiconductor substrate. Accordingly, the generation of an undesirable protruding portion, such as the protruding portion 21a of the above-mentioned related art of FIG. 1, can be effectively avoided in the first method, to realize a good coverage of the metal wiring at the contact hole in the subsequent process, resulting in the high reliability of the manufactured semiconductor device.

According to the present invention, the above-mentioned object can be also achieved by a second method of manufacturing a semiconductor device, including the steps of: forming a first insulating layer, having at a surface thereof a concave area to which a contact hole is to be formed and a convex area, on a semiconductor substrate; and forming a high resistance portion including polycrystalline silicon, on the convex area. The second method also includes the steps of: forming an anti-etching barrier layer on the first insulating layer and the high resistance portion; forming a protection layer including SiN on the anti-etching barrier layer; and forming a second insulating layer including at least boron as an impurity on the protection layer. The second method further includes the steps of: forming the contact hole at the concave area from the second insulating layer to a surface of the semiconductor substrate by means of an etching technique; and forming a metal wiring in the contact hole and on the second insulating layer.

In the second method, since there is formed the anti-etching barrier layer between the high resistance portion and the protection layer, even when the shoulder broken condition is caused by the etching process to form the contact hole, i.e. a hole is made at the protection layer, the high resistance portion is still covered and thus protected by the anti-etching barrier layer. In other words, the shoulder breaking in the etching process to form the contact hole, is stopped by the anti-etching barrier layer, so as to avoid the electrical shortage of the metal wiring with the high resistance portion or the gate portion made of the high resistance portion including the polycrystalline silicon, and also avoid the degradation of the pressure and voltage resisting characteristic thereof, resulting in the high reliability of the manufactured semiconductor device.

According to the present invention, the above-mentioned object can be also achieved by the third method of manufacturing a semiconductor device, including the steps of: forming a first insulating layer, having at a surface thereof a concave area to which a contact hole is to be formed and a convex area, on a semiconductor substrate; forming a high resistance portion including polycrystalline silicon, on the convex area; and forming a protection layer including SiN on the first insulating layer and the high resistance portion. The third method also includes the steps of: forming an insulating interlayer which does not include boron, on the protection layer; and forming a second insulating layer including at least boron as an impurity on the insulating interlayer. The third method further includes the steps of: forming the contact hole at the concave area from the second insulating layer to a surface of the semiconductor substrate by means of an etching technique; and forming a metal wiring in the contact hole and on the second insulating layer.

In the third method, since there is formed the insulating interlayer, which does not include boron, between the protection layer including SiN and the second insulating layer including boron, the protection layer and the second insulating layer do not contact with each other. Thus, the N in the SiN of the protection layer and the boron of the second insulating layer do not chemically react with each other, to effectively avoid the generation of the undesirable alien substance such as $B_xN_y \cdot nH_2O$ by the chemical reaction, resulting in the high reliability of the manufactured semiconductor device.

Further objects and advantages of the present invention will be apparent from the following description of the preferred embodiment of the invention as illustrated in the accompanying drawings.

BRIEF DESCRIPTION OF THE DRAWINGS

FIG. 6, which are composed of FIGS. 6a, 6b and 6c, are schematic sectional views to explain an etching process to form a contact hole of the present invention.

DETAILED DESCRIPTION OF THE PREFERRED EMBODIMENTS

A preferred embodiment of the present invention will be described below with reference to the accompanying drawings.

Figure 3:
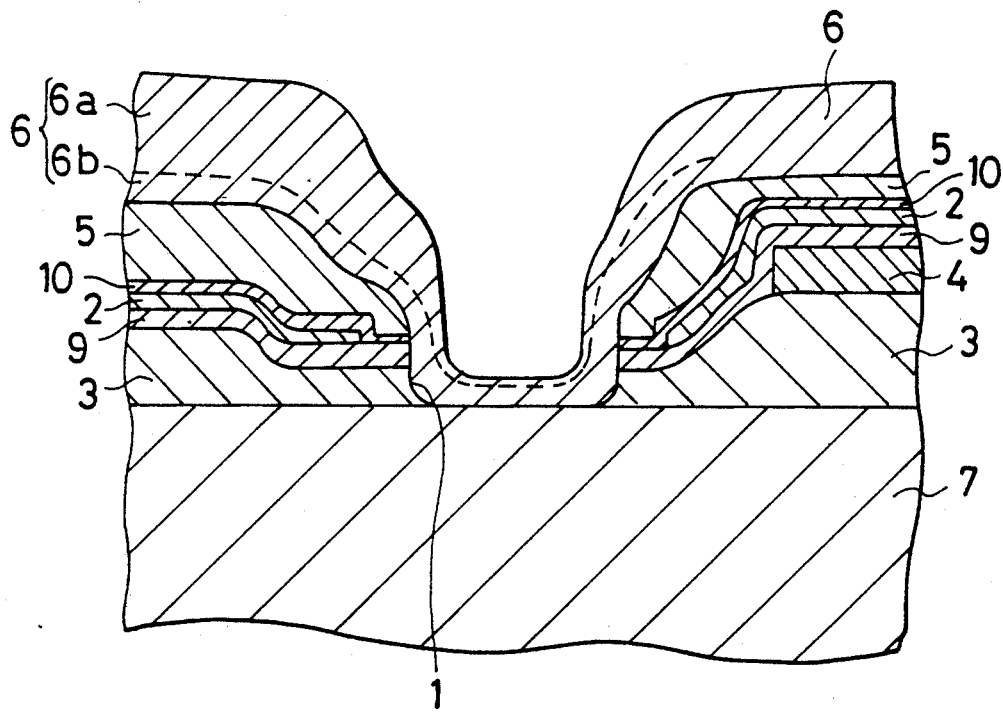
FIG. 3 is a schematic sectional view showing a portion of a semiconductor device as a first embodiment in one process of the manufacturing method according to the present invention.

FIG. 3 shows a sectional view of a characteristic portion of a semiconductor device as a first embodiment manufactured by a method according to the present invention. The processes of manufacturing this semiconductor device will be explained in detail hereinbelow, with referring to FIG. 3.

At first, an $SiO_2$ film 3 is deposited to be unevenly formed at the surface thereof, by means of CVD (Chemical Vapor Deposition) technique, on a substrate 7 made from Si. A Poly-Si film 4, having a high resistance and a prescribed pattern, is formed on the surface of the convex portion of the $SiO_2$ film 3.

An NSG (non-doped silicate glass) film 9 is deposited to be formed as an anti-etching barrier layer on overall surface on the $SiO_2$ film 3, and the Poly-Si film 4, with a thickness of about 1000 Å in $SiH_4 + O_2$ gas atmosphere with a temperature of about 400° C. by means of the normal pressure CVD technique. Thus formed NSG film 9 is annealed in an $N_2$ atmosphere with a temperature of about 900° C. Then, an SiN film 2 is deposited on the overall surface with a thickness of about 550 Å by means of a LP-CVD (Low Pressure-CVD) technique.

At this time, the SiN film 2 may be formed by use of a mixture gas of $SiH_4 + NH_3$, or a mixture gas of $SiH_2Cl_2 + NH_3$. However, since the plasma SiN decreases the resistance of the Poli-Si film 4, PE-SiN is not preferable as this material.

Next, a patterning process is performed with respect to the SiN film 2, so that the SiN film 2 would not remain at the area of the contact hole 1, which is to be formed in the subsequent steps. This patterning process can be performed, for example, by means of the patterning technique using the resist and etching technique using the RIE.

Then, when the patterning process of the $SiN_2$ film 2 is finished, an NSG film 10 is deposited to be formed and annealed by the same way as that of the NSG film 9, with a thickness of about 1000 Å. This film thickness of the NSG film 10 is preferably made to be more than 500 Å with a consideration of the reliability, and is also preferably made to be not more than 3000 Å so as to allow an easy contact hole forming subsequent process. In this sense, the film thickness of about 1000 Å is the most preferable for the NSG film 10. Further, it is preferable to select the component of the NSG film 10 so that the etching rate of the NSG film 10 is same as or less than that of a BPSG film 5 to be formed in the subsequent process, in the condition of the contact etching by the RIE to form the contact hole.

The NSG film 10 plays a role of an insulating interlayer to prevent the generation of chemical composite such as $B_xN_y \cdot nH_2O$, as an undesirable alien substance, which would be otherwise generated by the direct contact of the SiN film 2 and the BPSG film 5.

From this point of view, in place of the NSG film 10 in the above-mentioned embodiment, an $SiO_2$ type CVD oxide film, such as a HTO (High Temperature Oxidation) film formed by means of the LP-CVD method, can be utilized as an insulating interlayer film which does not include B. The HTO film may be preferably deposited to be formed by use of $SiH_4+N_2O$ gas with a temperature of about 800° C.

Then, on the overall surface of the NSG film 10, the BPSG film 5 is deposited to be formed by means of a normal pressure CVD technique using, for example, $SiH_4+O_2+B_2H_6+PH_3$ with a temperature of about 400° C., and then melted in an $N_2$ atmosphere with a high temperature in the range of 900° C. to 950° C.

At this time, it is preferable that the film thickness of the BPSG film 5 and the concentrations of the B and P (phosphor) are adjusted depending on the LSI structure of the semiconductor device. In this embodiment, the ratio of the concentration B/P is set to be 3.5 wt %/3.7 mol %, and the film thickness of the BPSG film 5 is set to be about 5000 Å, while thus formed BPSG film 5 is melted by a heat processing in an the $N_2$ atmosphere with a temperature of about 950° C. in 30 minutes.

In place of thus formed BPSG film 5, an insulating film including B as an impurity, such as a BSG (borosilicate glass) film formed by means of the normal pressure CVD method, may be utilized in the present embodiment. Alternatively, a BPSG film or a BSG film, which is formed by means of the normal or reduced pressure CVD method using TEOS, TMB, TMP, $O_2$ etc. as the raw material, may be utilized in the present embodiment.

Then, after the contact pattern is formed by a resist, a contact hole 1 is formed by means of the wet etching followed by the dry etching process (RIE), a metal film 6 is deposited by a spattering technique. In this embodiment, the metal film 6 is formed to have double layers i.e., for example, an Al-Si (aluminum silicon) film 6a with a thickness of 0.6 μm and a TiW (titanium tungstate) film 6b with a thickness of 0.3 μm, which has a good coverage to enhance the electrical contact between the BPSG film 5 and the Si substrate 7. Alternatively, the metal film 6 may be made from a single Al-Si film.

One of the characteristics of the thusly constructed first embodiment is the existence of the NSG film 10 between the SiN film 2 and the BPSG film 5. Because of the NSG film 10, the chemical reaction of N in the SiN film 2 and B in the BPSG film 5 can be effectively prevented since they are not directly contacted with each other, while each of the BPSG film 5 and the SiN film 2 is chemically much less active with the NSG film 10.

The construction and the effect of the SiN film 2, which is another characteristic of the first embodiment, will be explained later in detail in a subsequent second embodiment.

The construction and the effect of the NSG film 9, which is another characteristic of the first embodiment will be explained later in detail in a subsequent third embodiment.

The second embodiment will described hereinbelow with referring to FIG. 4, which especially has a characteristic to eliminate the generation of the protruding portion 21a in the aforementioned related art of FIG. 1.

Figure 4:
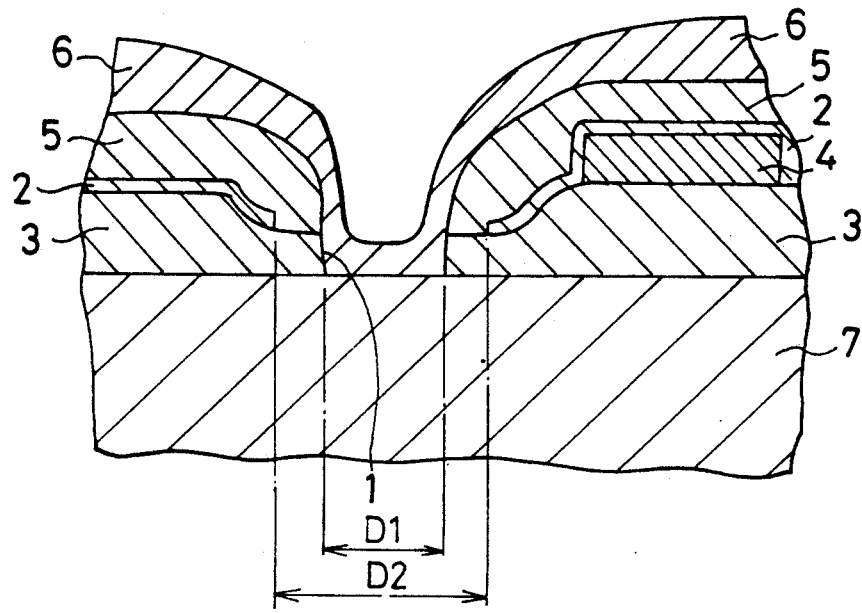
FIG. 4 is a schematic sectional view showing a portion of a semiconductor device as a second embodiment in one process of the manufacturing method according to the present invention.

In FIG. 4, the same elements as those of the first embodiment carry the same reference numerals. The second embodiment has such a construction that the NSG film 9 and the NSG film 10 are omitted in the construction of the first embodiment.

As shown in FIG. 4, the contact hole 1 is formed to have a prescribed size (designated by a diameter D1). In the manufacturing process, after the SiN film 2 is deposited to be formed on the overall surface, the area of the SiN film 2 corresponding to the area where the contact hole 1 is to be formed, is removed by the patterning technique such that the size of the removed portion (designated by a diameter D2) is larger than the size of the contact hole 1. Thus, when the contact hole 1 is formed, the edge of the SiN film 2 is not exposed at the side wall portion of the contact hole 1, with the result to eliminate the undesirable generation of the protruding portion as the related art of FIG. 1.

Figure 2:
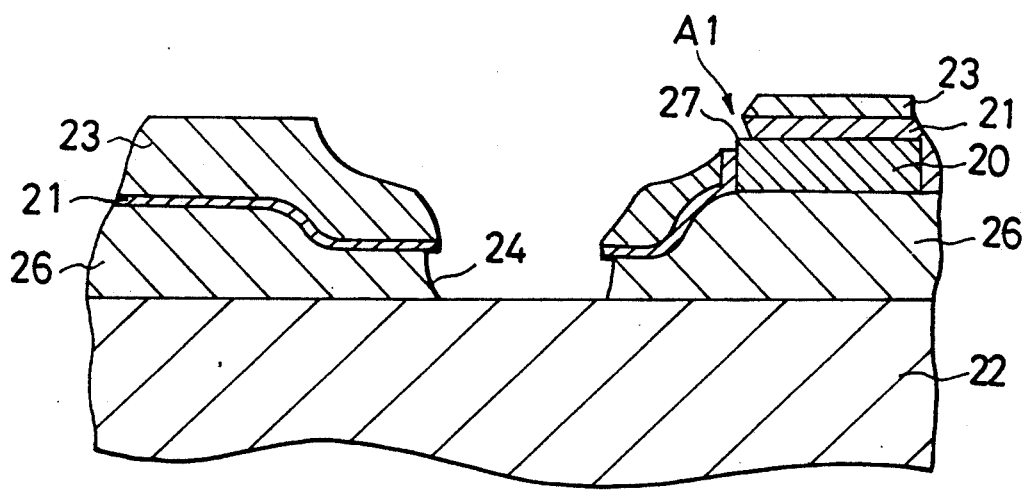
FIG. 2 is a schematic sectional view showing a portion of a semiconductor device in another process of the manufacturing method according to the related art.

The third embodiment will be described hereinbelow with referring to FIG. 5, which especially has a characteristic to prevent the Poli-Si film 4 from being exposed due to the shoulder broken condition as in the aforementioned related art of FIG. 2.

Figure 5:
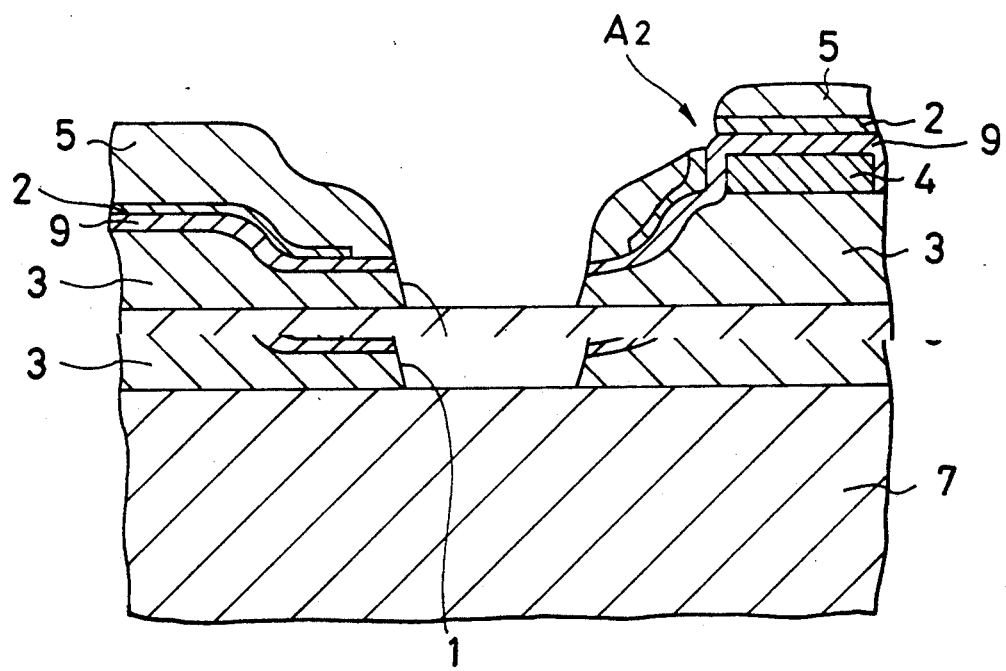
FIG. 5 is a schematic sectional view showing a portion of a semiconductor device as a third embodiment in one process of the manufacturing method of the present invention.

In FIG. 5, the same elements as those of the first embodiment carry the same reference numerals. The third embodiment has such a construction that the NSG film 10 is omitted in the construction of the first embodiment. FIG. 5 shows a state of the semiconductor device before the metal wiring 6 is formed.

As shown in FIG. 5, the NSG film 9 is formed between the Poli-Si film 4 and the SiN film 2. In the process of forming the contact hole 1, the NSG film 9 serves as an anti-etching barrier layer to prevent the Poli-Si film 4 from being exposed even if a hole is formed in the SiN film 2 upon encountering the shoulder broken condition as indicated by an arrow A2. At this time, the thickness of the SiN film 2 is preferably selected according to the etching rate of the relevant etching process to form the contact hole 1. The preferable film thickness of the SiN film 2 may be more than 550 Å, or more preferably more than 1000 Å, depending on the etching rate.

Next, the etching process employed in the above-mentioned embodiments as well as the effect and advantage of the present embodiments, will be explained in detail with referring to FIGS. 6a, 6b, and 6c. In FIGS. 6a, 6b, and 6c, only the substrate 7 and the BPSG film 5 are illustrated for the convenience of the explanation.

As shown in FIG. 6a, a first etching step to form the contact hole 1, i.e. a HF (hydrogen fluoride) type wet etching (round etching) is performed with respect to the BPSG film 5 covered with a resist pattern 30. By use of the HF type etching, the CVD film of the oxide film type, i.e. the BPSG film 5 is mainly etched. In this condition, the SiN film is hardly etched by this HF type etching.

Then, as shown in FIG. 6b, a second etching step to complete the contact hole 1, i.e. a RIE type etching (RIE+CHF$_3$+CF$_4$+Ar) is performed with respect to the CVD film of the oxide film type. In this condition, the SiN film is hardly etched compared with SiO film.

Figure 1:
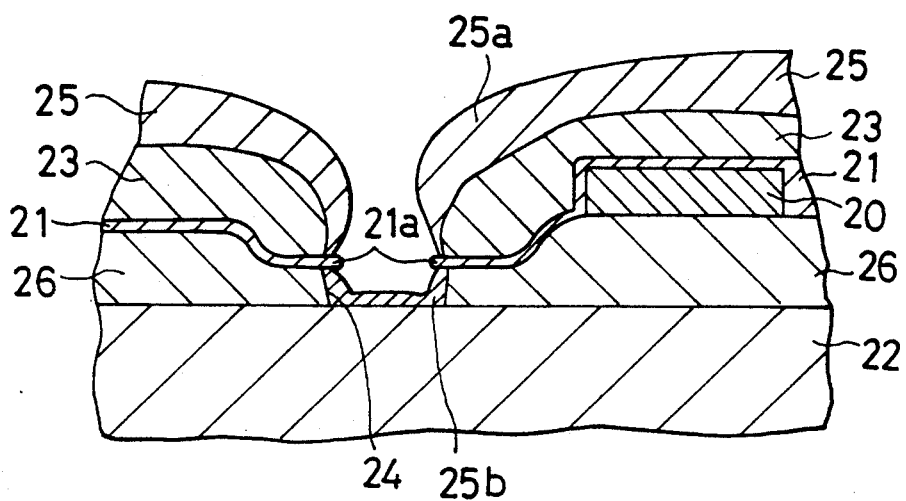
FIG. 1 is a schematic sectional view showing a portion of a semiconductor device in one process of the manufacturing method according to the related art.

Thus, since the SiN film is hardly etched in the above-mentioned first and second steps, in the case of the aforementioned related art of FIG. 1, the undesirable protruded portion 21a of the SiN film 21 is not formed.

On the contrary, since the SiN film 2 is not exposed at the side wall portion of the contact hole 1 during these first and second etching processes, in the above explained present embodiments, the protruded portion is not formed, regardless of the fact that the SiN film is hardly etched by this HF etching.

In this way, the aforementioned first problem of the related art can be solved by the present embodiments.

Then, as shown in FIG. 6c, a third etching step to obtain an ohmic contact between the metal wiring and the contact bottom, i.e. a contact plasma etching with an etching condition (RIE+CF$_4$+O$_2$) is performed with respect to the Si substrate 7. At this time, the CVD film of the oxide film type is hardly etched. However, in addition to the Si substrate 7, the SiN film is also etched in this condition. Thus, the aforementioned shoulder broken condition is caused. Accordingly, in the case of the aforementioned related art, the Poli-Si film has a certain possibility to be exposed by this third etching step. On the contrary, since there exists the NSG film 9 between the SiN film 2 and the Poli-Si film 4, the Poli-Si film 4 is effectively prevented to be exposed even if the shoulder broken condition is caused, in the first and third embodiments.

In this way, the aforementioned second problem of the related art can be solved by the present embodiments.

As described above, the second embodiment is characterized in that the SiN film 2 is patterned in a specific shape at the vicinity of the contact hole so as to solve the first problem of the related art. Namely, in the second embodiment, the contact hole can be formed in a good shape without the protruding portion at the side wall portion, to accomplish a reliable metal wiring by a relatively easy metal wiring process, resulting in the high reliability of the manufactured semiconductor device.

The third embodiment is characterized in that it includes the NSG film 9, so as to solve the second problem of the related art. Namely, in the third embodiment, the Poli-Si film 4 is protected by the NSG film 9 upon encountering the shoulder broken condition, resulting in the high reliability of the manufactured semiconductor device.

The first embodiment is characterized in that it has both advantages of the second and third embodiments, and further includes the NSG film 10 between the SiN film 2 and the BPSG film 5 so as to solve the third problem of the related art. Namely, in the first embodiment, the generation of the undesirable alien substance due to the chemical reaction of the SiN film 2 and the BPSG film 5, is effectively prevented, resulting in the high reliability of the manufactured semiconductor device.

Many widely different embodiments of the present invention may be constricted without departing from the spirit and scope of the present invention. It should be understood that the present invention is not limited to the specific embodiments described in this specification, except as defined in the appended claims.

What is claimed is:

1. A method of manufacturing a semiconductor device, comprising the steps of:
   forming a first insulating layer, having at a surface thereof a concave area to which a contact hole is to be formed and a convex area, on a semiconductor substrate;
   forming a high resistance portion comprising polycrystalline silicon, on said convex area;
   forming a protection layer comprising SiN on said first insulating layer and said high resistance portion;
   removing a portion of said formed protection protection layer at said concave area such that said removed portion includes an area to form said contact hole and is larger than said area to form said contact hole before forming said contact hole;
   forming a second insulating layer including at least boron as an impurity on said protection layer and said first insulating layer;
   forming said contact hole at said concave area from said second insulating layer to a surface of said semiconductor substrate by means of an etching technique; and
   forming a metal wiring in said contact hole and on said second insulating layer.

2. A method according to claim 1, wherein said step of forming said protection layer comprises a CVD technique, and said step of removing said portion of said formed protection layer comprises a patterning technique.

3. A method according to claim 1, wherein said step of forming said contact hole comprises a HF type wet etching process and a RIE type etching process.

4. A method of manufacturing a semiconductor device comprising the steps of:
   forming a first insulating layer, having at a surface thereof a concave area to which a contact hole is to be formed and a convex area, on a semiconductor substrate;
   forming a high resistance portion comprising polycrystalline silicon, on said convex area;
   forming an anti-etching barrier layer on said first insulating layer and said high resistance portion;
   forming a protection layer comprising SiN on said anti-etching barrier layer;
   forming a second insulating layer including at least boron as an impurity on said protection layer;
   forming said contact hole at said concave area from said second insulating layer to a surface of said semiconductor substrate by means of an etching technique such that said high resistance portion is prevented by said anti-etching barrier layer from being exposed to an etching condition; and
   forming a metal wiring in said contact hole and on said second insulating layer.

5. A method according to claim 4, wherein said anti-etching barrier layer comprises an NSG film formed by means of a CVD technique.

6. A method according to claim 4, wherein said step of forming said contact hole comprises a contact plasma etching technique.

7. A method of manufacturing a semiconductor device, comprising the steps of:

forming a first insulating layer, having at a surface thereof a concave area to which a contact hole is to be formed and a convex area, on a semiconductor substrate;

forming a high resistance portion comprising polycrystalline silicon, on said convex area;

forming a protection layer comprising SiN on said first insulating layer and said high resistance portion;

forming an insulating interlayer which does not include boron, on said protection layer;

forming a second insulating layer including at least boron as an impurity on said insulating interlayer such that said second insulating layer does not have contact with said protection layer by the existence of said insulating interlayer therebetween;

forming said contact hole at said concave area from said second insulating layer to a surface of said semiconductor substrate by means of an etching technique; and forming a metal wiring in said contact hole and on said second insulating layer.

8. A method according to claim 7, wherein said insulating interlayer comprises an NSG film or a HTO film formed by means of a CVD technique.

9. A method according to claim 7, wherein said second insulating layer comprises a BPSG film or a BSG film by means of a CVD technique 10. A method of manufacturing a semiconductor device, comprising the steps of:

forming a first insulating layer, having at a surface thereof a concave area to which a contact hole is to be formed and a convex area, on a semiconductor substrate;

forming a high resistance portion comprising polycrystalline silicon, on said convex area;

forming an anti-etching barrier layer on said first insulating layer and said high resistance portion;

forming a protection layer comprising SiN on said anti-etching barrier layer;

removing a portion of said formed protection layer at said concave area such that said removed portion includes an area to form said contact hole and is larger than said area to form said contact hole before forming said contact hole;

forming an insulating interlayer which does not include boron, on said protection layer and said anti-etching barrier layer;

forming a second insulating layer including at least boron as an impurity on said insulating interlayer such that said second insulating layer does not have contact with said protection layer by the existence of said insulating interlayer therebetween;

forming said contact hole at said concave area from said second insulating layer to a surface of said semiconductor substrate by means of an etching technique such that said high resistance portion is prevented by said anti-etching barrier layer from being exposed to an etching condition; and forming a metal wiring in said contact hole and on said second insulating layer.

* * * * *